(12) United States Patent
Jeong et al.

(10) Patent No.: US 10,068,930 B2
(45) Date of Patent: Sep. 4, 2018

(54) DISPLAY DEVICE

(71) Applicant: Samsung Display Co., Ltd., Yongin-si, Gyeonggi-do (KR)

(72) Inventors: Sol Ip Jeong, Namyangju-si (KR); Sung Hee Hong, Hwaseong-si (KR); Se Jin Kim, Cheonan-si (KR); Joong Tae Kim, Icheon-si (KR); Yang Ho Bae, Seoul (KR); Kyung Suk Jung, Cheonan-si (KR); Beom Hee Han, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 10 days.

(21) Appl. No.: 15/430,293

(22) Filed: Feb. 10, 2017

(65) Prior Publication Data

US 2017/0294450 A1 Oct. 12, 2017

(30) Foreign Application Priority Data

Apr. 8, 2016 (KR) .................. 10-2016-0043257

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 27/12* | (2006.01) |
| *G02F 1/1333* | (2006.01) |
| *G02F 1/1343* | (2006.01) |
| *G02F 1/1362* | (2006.01) |
| *G02F 1/1368* | (2006.01) |

(52) U.S. Cl.
CPC ........ *H01L 27/124* (2013.01); *G02F 1/13439* (2013.01); *G02F 1/133345* (2013.01); *G02F 1/134309* (2013.01); *G02F 1/136286* (2013.01); *H01L 27/1248* (2013.01); *G02F 1/1368* (2013.01); *G02F 2001/134345* (2013.01)

(58) Field of Classification Search
USPC ....... 257/72, 252–254, 257–258; 438/22, 24, 438/28
See application file for complete search history.

(56) References Cited

U.S. PATENT DOCUMENTS

2014/0291636 A1* 10/2014 Kim ................ H01L 27/3262
257/40
2016/0300864 A1* 10/2016 Seo ................. H01L 27/1255

FOREIGN PATENT DOCUMENTS

KR 10-2004-0059066 A 7/2004
KR 10-2007-0082090 A 8/2007

(Continued)

*Primary Examiner* — Tram H Nguyen
(74) *Attorney, Agent, or Firm* — Innovation Counsel LLP

(57) ABSTRACT

A display device comprising a first electrode that comprises a first region, a second region, and a third region located between the first region and the second region; a first insulating film disposed on the first electrode; a second electrode that is disposed on the first insulating film and comprises a fourth region overlapping the third region; a second insulating film disposed on the second electrode; a contact hole formed through the second insulating film, the first contact hole exposing the first, second and fourth regions; and a third electrode that is disposed on the second insulating film to cover the first contact hole, and is connected to at least one of the first region and the second region exposed by the first contact hole and the fourth region exposed by the first contact hole.

20 Claims, 22 Drawing Sheets

(56) References Cited

FOREIGN PATENT DOCUMENTS

| KR | 10-2010-0068860 A | 6/2010 |
| KR | 10-2011-0038917 A | 4/2011 |
| KR | 10-2013-0037944 A | 4/2013 |

\* cited by examiner

DISPLAY DEVICE

This application claims priority to Korean Patent Application No. 10-2016-0043257 filed on Apr. 8, 2016 in the Korean Intellectual Property Office, the disclosure of which is incorporated herein by reference in its entirety.

BACKGROUND

1. Field

The present inventive concept relates to a display device.

2. Description of the Related Art

The importance of display devices has increased with the development of multimedia. Various types of display devices such as a liquid crystal display (LCD) and an organic light emitting display (OLED) are used correspondingly.

The liquid crystal display is a display device that displays an image, using the electro-optical characteristics of the liquid crystal in which light transmittance varies depending on the intensity of the electric field applied to the liquid crystal. The liquid crystal display includes a plurality of pixels. A pixel electrode and a color filter are disposed in each pixel. Each pixel electrode is driven by a thin film transistor.

Further, the organic light emitting display displays an image, using an organic light emitting diode that generates light by recombination of electrons and holes. The organic light emitting displays have high brightness and viewing angle, while having a fast response speed and low power consumption.

In an embodiment, the display device uses a method of forming a contact hole in an insulating film located between two electrodes and forming a connection electrode in the contact hole, in order to electrically connect the two electrodes disposed on the layers different from each other.

SUMMARY

Exemplary embodiments provide electronic devices including stretchable wirings.

Additional aspects will be set forth in the detailed description which follows, and, in part, will be apparent from the disclosure, or may be learned by practice of the inventive concept.

An exemplary embodiment of the present inventive concept discloses a display device comprising: a first electrode that comprises a first region, a second region, and a third region located between the first region and the second region; a first insulating film disposed on the first electrode; a second electrode that is disposed on the first insulating film and comprises a fourth region overlapping the third region; a second insulating film disposed on the second electrode; a first contact hole formed through the second insulating film, the first contact hole exposing the first, second and fourth regions, and a third electrode that is disposed on the second insulating film to cover the first contact hole, and is connected to at least one of the first region and the second region exposed by the first contact hole and the fourth region exposed by the first contact hole.

Widths of the first and second regions may not be zero. The first and second regions may not overlap the second electrode.

The first insulating film may include at least one undercut portion disposed in a region overlapping the third region.

The fourth region may completely overlap the third region.

The width of the first region may be different from or identical to the width of the second region.

At least one of the first and second insulating films may include an inorganic material.

The display device may further include an organic insulating film disposed on the second insulating film; and a second contact hole that at least partially overlaps the first contact hole. The third electrode may be disposed on the organic insulating film to cover the second contact hole.

The display device may further include a plurality of gate lines disposed on the same layer as the first electrode and a plurality of data lines disposed on the same layer as the second electrode.

The third electrode may include a transparent conductive material.

The first and second electrodes may include an opaque conductive material.

An exemplary embodiment of the present inventive concept also discloses a display device comprising: a first electrode that comprises a first region, a second region, and a third region located between the first region and the second region; a first insulating film that is disposed on the first electrode and comprises a first opening for exposing the first and second regions; a second electrode that is disposed on the first insulating film and comprises a fourth region overlapping the third region; a second insulating film that is disposed on the second electrode and comprises a second opening for exposing the first, second and fourth regions; and a third electrode that is disposed on the second insulating film and is connected to at least one of the first region and the second region, and the fourth region.

The second electrode may not overlap the first and second regions.

The third electrode may include a transparent conductive material.

The display device may further include a gate line that is disposed on the same layer as the first electrode and extends in a first direction, a data line that is disposed on the same layer as the second electrode, and extends in a second direction different from the first direction and a pixel electrode disposed on the same layer as the third electrode.

The first electrode may extend in the first direction, and the third electrode may extend in the second direction.

The pixel electrode may include a first sub-pixel electrode connected to a first switching element, the first switching element being connected to the gate line and the data line, and a second sub-pixel electrode connected to a second switching element, the second switching element being connected to the gate line and the data line. The display device may further include a third switching element connected to the second sub-pixel electrode, the gate line and the first electrode. The first electrode may be a storage line and the second electrode may be a source electrode of the third switching element.

The display device may further include an organic insulating film that is disposed on the second insulating film and exposes the first, second and fourth regions. The third electrode may be disposed on the organic insulating layer and may be in contact with the first, second and fourth regions.

Widths of the first and second regions may not be zero.

The width of the first region may be identical to or different from the width of the second region.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION

Figure 1:
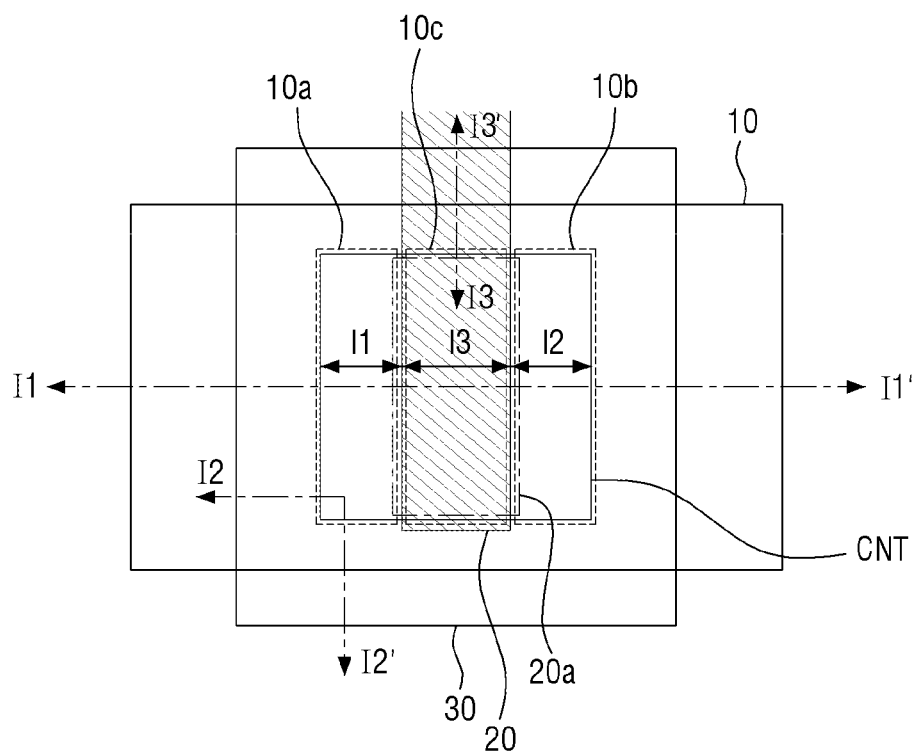
FIG. 1 is a plan view illustrating a contact structure in a display device according to an embodiment of the present inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

Figure 2:
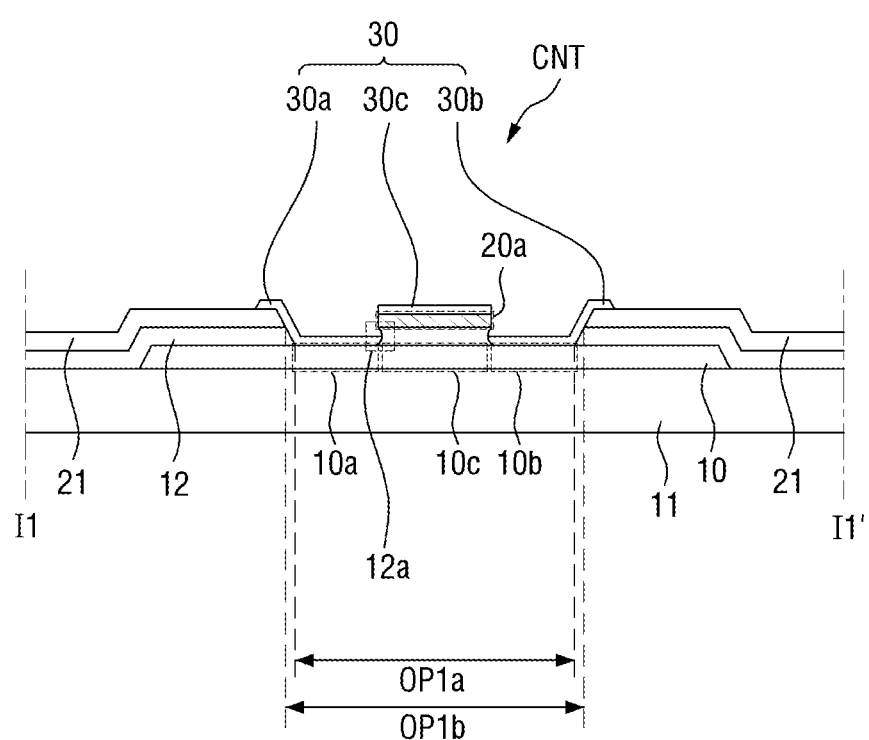
FIG. 2 is a cross-sectional view taken along the line I1-I1' illustrated in FIG. 1.
Figure 3:
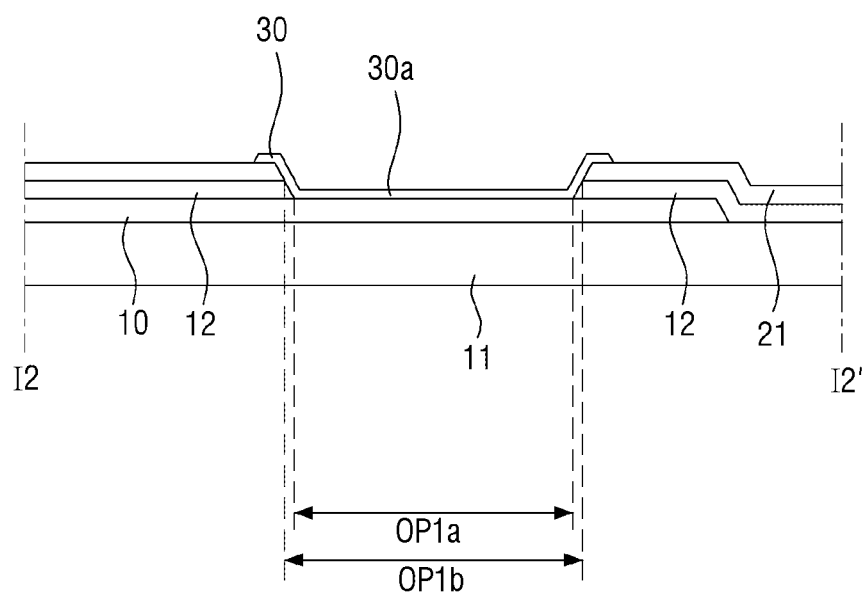
FIG. 3 is a cross-sectional view taken along the line I2-I2' illustrated in FIG. 1.
Figure 4:
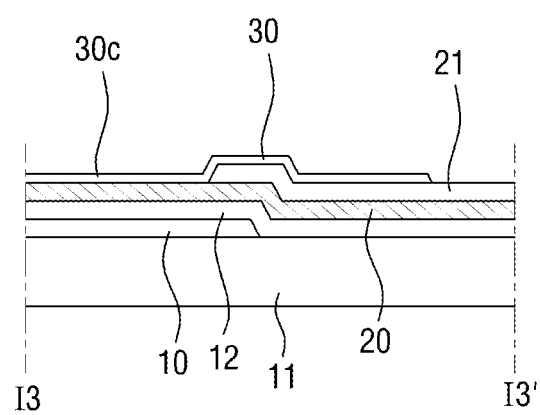
FIG. 4 is a cross-sectional view taken along the line I3-I3' illustrated in FIG. 1.

FIG. 1 is a plan view illustrating a contact structure of a display device according to an embodiment of the present inventive concept. FIG. 2 is a cross-sectional view taken along the line I1-I1' illustrated in FIG. 1. FIG. 3 is a cross-sectional view taken along the line I2-I2' illustrated in FIG. 1. FIG. 4 is a cross-sectional view taken along the line I3-I3' illustrated in FIG. 1.

Referring to FIGS. 1 and 2, the substrate 11 may be a transparent glass substrate or a plastic substrate in an embodiment. Further, the substrate 11 may also have flexibility. That is, the substrate 11 may be deformed, by rolling, folding, banding or the like.

A first electrode 10 may be disposed on the substrate 11. The first electrode 10 may include a first region 10a, a second region 10b and a third region 10c. The third region 10c may be disposed between the first region 10a and the second region 10b. Meanwhile, the first region 10a may be defined as a region that is disposed on one side of the third region 10c, while not overlapping a second electrode 20 which will be described later. Further, the second region 10b may be defined as a region that is disposed on the other side of the third region 10c, while not overlapping a second electrode 20 which will be described later. The third region 10c may be defined as a region that is disposed between the first and second regions 10a and 10b, while overlapping the second electrode 20 to be described later, and more particularly, a fourth region 20a of the second electrode 20.

A width l1 of the first region 10a, a width l2 of the second region 10b and a width l3 of the third region 10c may be identical to each other and may be different from each other. However, each of the widths l1, l2 and l3 of the first to third regions 10a and 10b and 10c is not zero.

In an embodiment, the first electrode 10 may be formed of a single film including conductive metals such as aluminum (Al), copper (Cu), molybdenum (Mo), chromium (Cr), titanium (Ti), tungsten (W), molybdenum-tungsten (MoW), molybdenum-titanium (MoTi) and copper/molybdenum-titanium (Cu/MoTi), a double film including at least two elements or a triple film including three elements.

Further, in another embodiment, the first electrode 10 may be formed of a transparent conductive material such as ITO or IZO or a reflective metal such as aluminum, silver, chromium or an alloy thereof.

The first insulating film 12 may be disposed on the first electrode 10. The first insulating film 12 may be formed of silicon nitride (SiNx) or silicon oxide (SiOx) in an embodiment. The first insulating film 12 may have a multi-film structure including at least two insulating layers having different physical characteristics.

Meanwhile, the first insulating film 12 may include an undercut portion 12a. The undercut portion 12a will be described later.

The first insulating film 12 may include a first opening OP1a that exposes the first region 10a and the second region 10b of the first electrode 10. Meanwhile, the first opening OP1a does not expose the third region 10c of the first electrode 10. Accordingly, the first insulating film 12 is disposed on the third region 10c of the first electrode 10.

The second electrode 20 may be disposed on the first insulating film 12. The second electrode 20 at least partially overlaps the first electrode 10. More specifically, the second electrode 20 may include a fourth region 20a which overlaps the third region 10c of the first electrode 10. The fourth region 20a of the second electrode 20 may completely overlap the third region 10c of the first electrode 10 in an embodiment.

Meanwhile, the shapes or the sizes of the first and second regions 10a and 10b are not limited to those illustrated in FIG. 1 as long as the first and second regions are exposed by the first opening OP1a. Further, the shape or the size of the third region 10c is not limited to that illustrated in FIG. 1 as long as the third region is not exposed by the first opening OP1a.

Meanwhile, the shape or the size of the fourth region 20a is not limited to that illustrated in FIG. 1 unless each of the widths l1 and l2 of the first region 10a and the second of region 10b of the first electrode 10 is zero.

In an embodiment, the second electrode 20 may be formed of a single film including conductive metals such as aluminum (Al), copper (Cu), molybdenum (Mo), chromium (Cr), titanium (Ti), tungsten (W), molybdenum-tungsten (MoW), molybdenum-titanium (MoTi) and copper/molybdenum-titanium (Cu/MoTi), a double film including at least two elements or a triple film including three elements.

Further, in another embodiment, the second electrode 20 may be formed of a transparent conductive material such as ITO or IZO or a reflective metal such as aluminum, silver, chromium or an alloy thereof.

The second insulating film 21 may be disposed on the second electrode 20. The second insulating film 21 may be formed of an inorganic insulator such as silicon nitride (SiNx) or silicon oxide (SiOx) in an embodiment. The second insulating film 21 may include a second opening OP1b that exposes the first and second regions 10a and 10b of the first electrode 10, and the fourth region 20a of the second electrode 20. The second opening OP1b may at least partially overlap the first opening OP1a.

A contact hole CNT is formed by the first opening OP1a and the second opening OP1b, and consequentially exposes the first and second regions 10a and 10b of the first electrode 10, and the fourth region 20a of the second electrode 20. The contact hole CNT is illustrated in a rectangular form in FIG. 1, but it is not limited thereto.

The third electrode 30 may be disposed on the second insulating film 21. The third electrode 30 may be formed of a single film including conductive metals such as aluminum (Al), copper (Cu), molybdenum (Mo), chromium (Cr), titanium (Ti), tungsten (W), molybdenum-tungsten (MoW), molybdenum-titanium (MoTi) and copper/molybdenum-titanium (Cu/MoTi), a double film including at least two elements or a triple film including three elements.

Further, in another embodiment, the third electrode 30 may be formed of a transparent conductive material such as ITO or IZO or a reflective metal such as aluminum, silver, chromium or an alloy thereof.

Hereinafter, the description will be given of a case where the first electrode 10 and the second electrode 20 are opaque conductive metals, and the third electrode 30 is a transparent conductive metal in the present specification.

The third electrode 30 may be formed to cover the contact hole CNT. Thus, a portion 30a of the third electrode 30 may be in direct contact with the first region 10a of the first electrode 10 exposed by the contact hole CNT. Another portion 30b of the third electrode 30 may be in direct contact with the second region 10b of the first electrode 10 exposed by the contact hole CNT. Still another portion 30c of the third electrode 30 may be in direct contact with the second electrode 20 exposed by the contact hole CNT, and more particularly, the fourth region 20a.

However, a portion 30a and another portion 30b of the third electrode 30 are not in contact with another portion 30c of the third electrode 30 within the contact hole CNT. That is, as the first insulating film 12 of FIG. 2 includes an undercut portion 12a, some portions 30a and 30b of the third electrode 30 and still another portion 30c of the third electrode 30 are not in direct contact with each other.

In more detail, as a portion 30a and another portion 30b of the third electrode 30 are not in direct contact with still another portion 30c of the third electrode 30, the first and second regions 10a and 10b of the first electrode 10 are not connected to the fourth region 20a of the second electrode 20 within the contact hole CNT.

In contrast, further referring to FIG. 3, a portion 30a of the third electrode 30 is in direct contact with the first region 10a of the first electrode 10 exposed by the contact hole CNT. Further, another portion 30b of the third electrode 30 is also in direct contact with the second region 10b of the first electrode 10 exposed by the contact hole CNT.

Further, referring to FIG. 4, still another portion of the third electrode 30 is in direct contact with the portion of the second electrode 20 exposed by the contact hole CNT.

Thus, although the first electrode 10 is not connected to the second electrode 20 within the contact hole CNT, since a portion of each of the first electrode 10 and the second electrode 20 is connected to the third electrode 30, the first electrode 10 and the second electrode 20 are consequentially electrically connected to each other.

A case where a predetermined voltage is applied to the first electrode 10 will be described as an embodiment. When a predetermined voltage is applied to the first electrode 10, the voltage applied to the first electrode 10 is transmitted to a portion 30a and another portion 30b of the third electrode 30 that is in direct contact with the first region 10a and the second region 10b of the first electrode 10. Thereafter, a predetermined transmitted voltage is transmitted to the second electrode 20 through still another portion 30c of the third electrode 30 that is in direct contact with the portion of the second electrode 30 exposed by the contact hole CNT. The voltage applied to the first electrode 10 is transmitted to the second electrode 20 accordingly.

Hereinafter, a method of manufacturing the display device illustrated in FIG. 1 will be described with reference to FIGS. 5 through 7. However, the repeated contents of the contents described in FIGS. 1 through 4 will not be provided.

Figure 5:
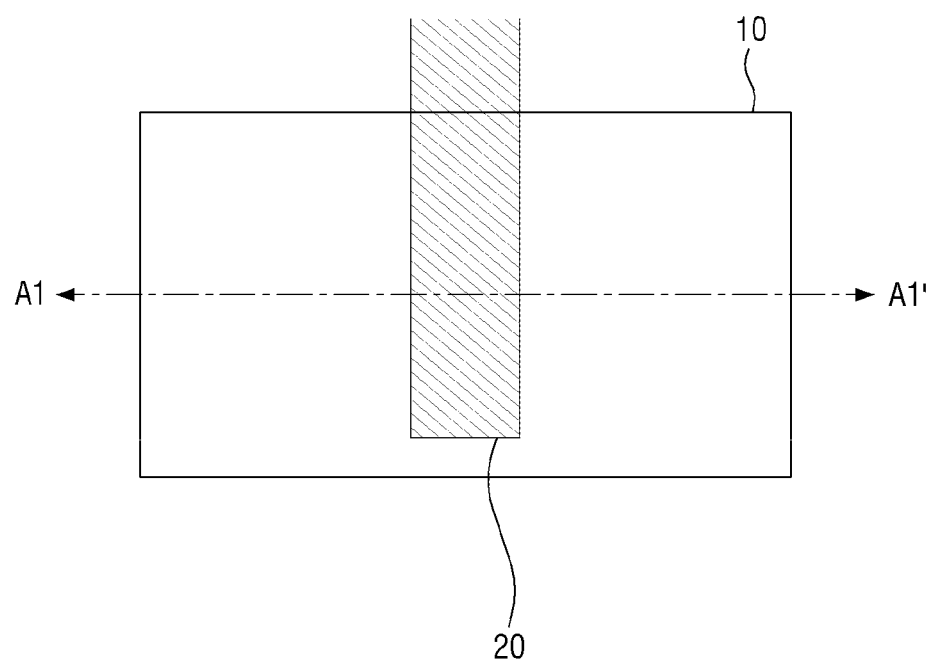
FIG. 5 is a plan view for explaining a first process of forming a contact structure of the display device according to an embodiment of the present inventive concept.
Figure 6:
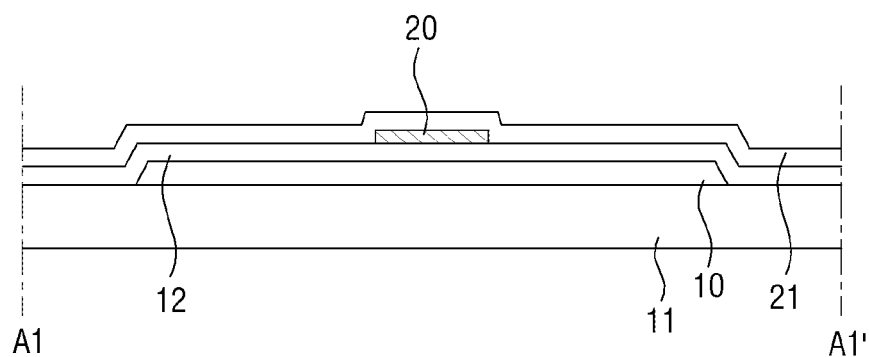
FIG. 6 is a cross-sectional view taken along the line A1-A1' of FIG. 5.
Figure 7:
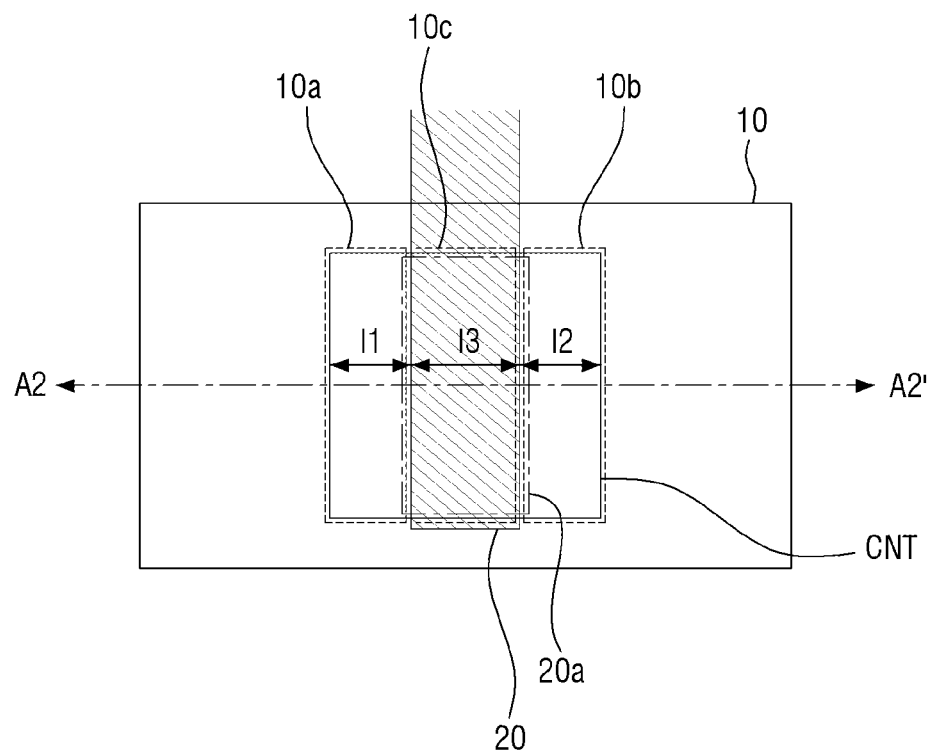
FIG. 7 is a plan view for explaining a second process of forming the contact structure of the display device according to an embodiment of the present inventive concept.
Figure 8:
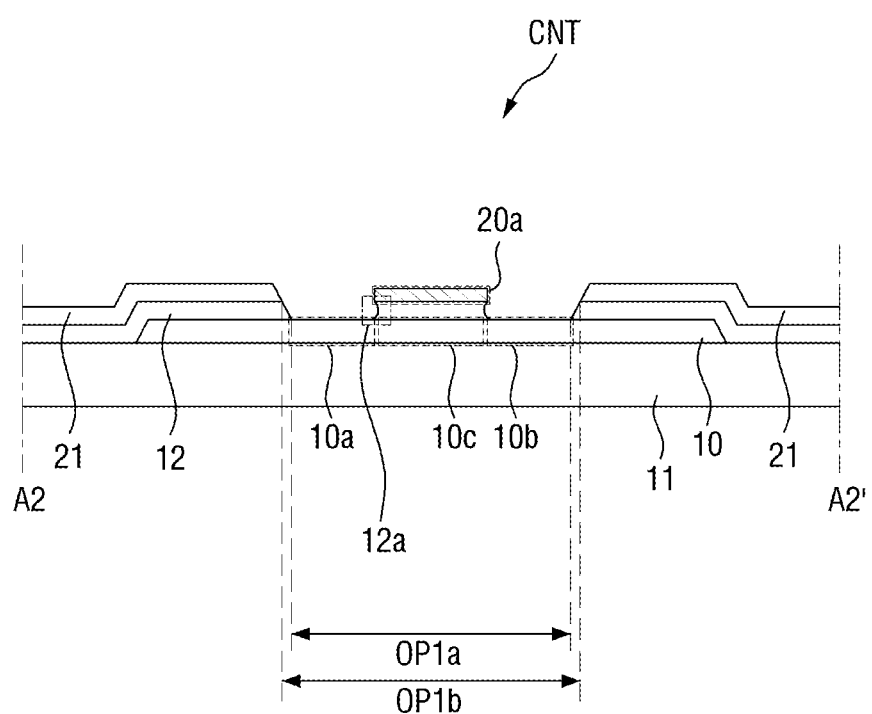
FIG. 8 is a cross-sectional view taken along the line A2-A2' of FIG. 7.
Figure 9:
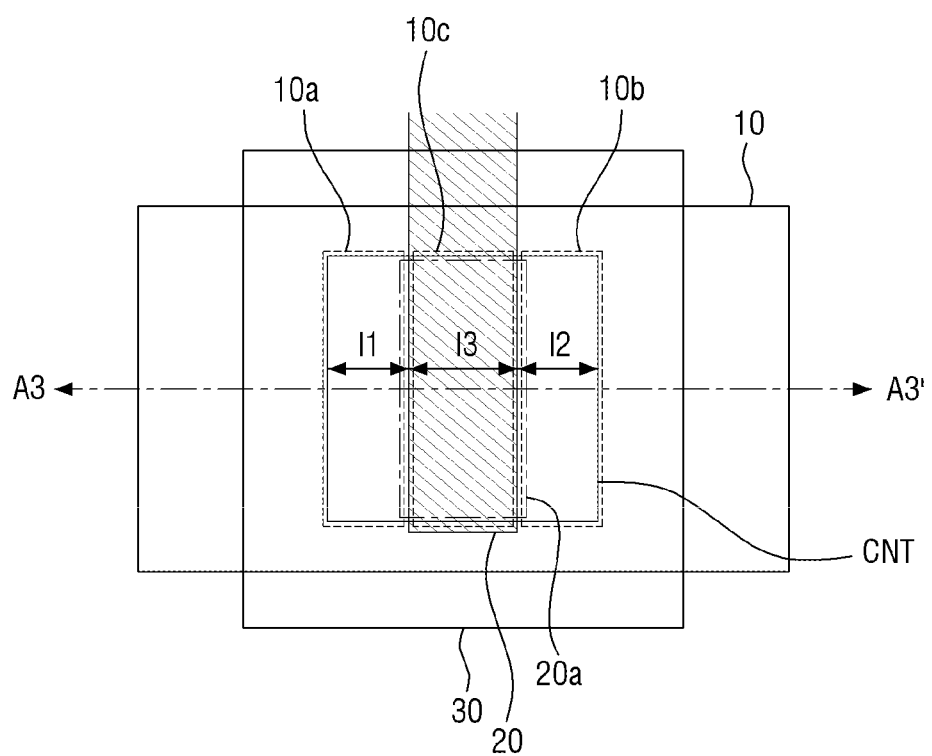
FIG. 9 is a plan view for explaining a third process of forming a contact structure of the display device according to an embodiment of the present inventive concept.
Figure 10:
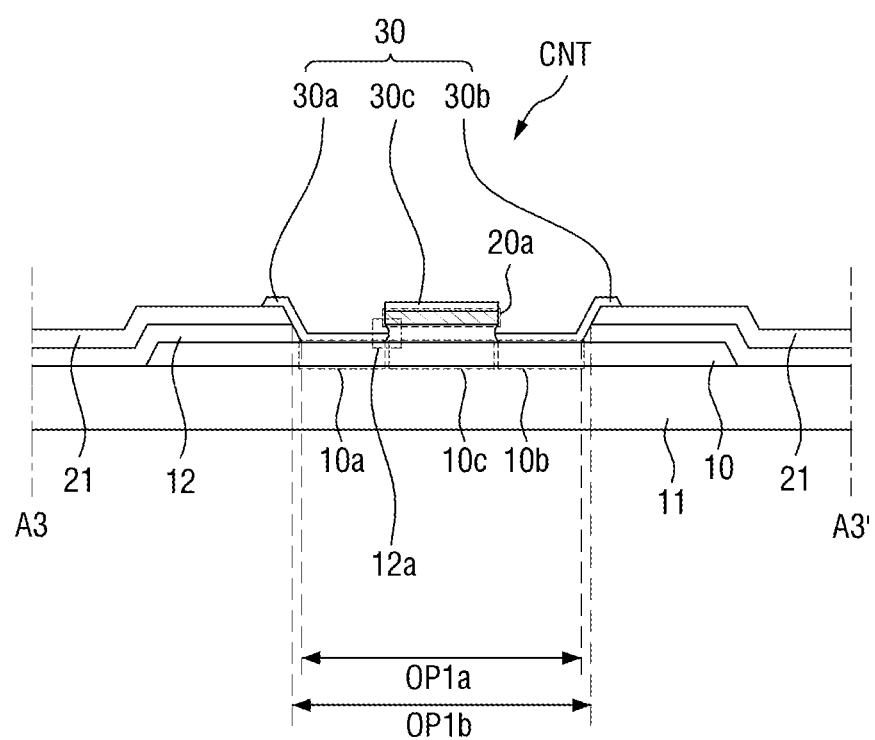
FIG. 10 is a cross-sectional view taken along the line A3-A3' of FIG. 9.

FIGS. 5, 7 and 9 are plan views for explaining a process of forming the contact structure of the display device according to an embodiment of the present inventive concept. FIG. 6 is a cross-sectional view taken along the line A1-A1' of FIG. 5. FIG. 8 is a cross-sectional view taken along the line A2-A2' of FIG. 7. FIG. 10 is a cross-sectional view taken along the line A3-A3' of FIG. 9.

First, referring to FIGS. 5 and 6, the first electrode 10 is formed on the substrate 11. Thereafter, the first insulating layer 12 is formed on the first electrode 10.

Next, a second electrode 20 is formed on the first insulating film 12. The second electrode 20 at least partially overlaps the first electrode 10. Thereafter, the second insulating film 21 is formed on the second electrode 20.

Next, referring to FIGS. 7 and 8, it is possible to form the contact hole CNT that exposes the first and second regions 10a and 10b of the first electrode 10 and the fourth region 20a of the second electrode 20, by simultaneously etching some of the first and second insulating films 11 and 21.

More particularly, the first and second insulating films 11 and 21 may be simultaneously etched through a single mask process. Thus, the first opening OP1a for exposing the first and second regions 10a and 10b of the first electrode 10 is formed on the first insulating film 12. Further, the second opening OP1b for exposing the first and second regions 10a and 10b of the first electrode 10 and the fourth region 20a of the second electrode 20 is formed on the insulating film 21. The number of mask processes can be minimized accordingly. Further, the etching process may be performed by a dry etching process in an embodiment.

Meanwhile, in the etching process of the first insulating film 12, an undercut portion 12a may be formed in the first insulating film 12 located in a region that overlaps the fourth region 20a of the second electrode 20.

Next, referring to FIGS. 9 and 10, the third electrode 30 may be formed on the second insulating film 21. The third electrode 30 may be formed to cover the contact hole CNT.

Thus, a portion 30a of the third electrode 30 may be in direct contact with the first region 10a of the first electrode 10 exposed by the contact hole CNT. Further, another portion 30b of the third electrode 30 may be in direct contact with the second region 10b of the first electrode 10 exposed by the contact hole CNT. Further, still another portion 30c of the third electrode 30 may be in direct contact with the second electrode 20 exposed by the contact hole CNT, and more particularly, the fourth region 20a.

However, a portion 30a and another portion 30b of the third electrode 30 are not in contact with the still another portion 30c of the third electrode 30 within the contact hole CNT. That is, as the first insulating film 12 of FIG. 7 includes the undercut portion 12a, some portions 30a and 30b of the third electrode 30 and another portion 30c of the third electrode 30 are not in direct contact with each other within the contact hole CNT.

Meanwhile, in the process of forming the contact hole CNT described in FIG. 7 and FIG. 8, an overlay shift may occur. More particularly, the overlay shift may occur by the mask misalignment during the mask process for forming the contact hole CNT. The degree of occurrence of the overlay shift phenomenon may increase when reducing the size of the contact hole CNT in order to secure a high resolution and a high aperture rate.

More specifically, even though both of the first insulating film 12 and the second insulating film 21 need to be etched through a single mask process, a problem in which the first insulating film 12 is not etched by the overlay shift phenomenon caused by the misalignment may occur. Thus, a case in which the third electrode 20 is not in contact with the first electrode 10 located below the first insulating film 12 may occur, and as a result, the first electrode 10 and the second electrode 20 are not electrically connected to each other.

In contrast, in the display device according to an embodiment of the present inventive concept, since the widths of each of the first region 10a and the second region 10b of the first electrode 10 are not zero, it is possible to secure a sufficient etching space of the first insulating film 12. This will be described with reference to FIGS. 11 to 14.

Figure 11:
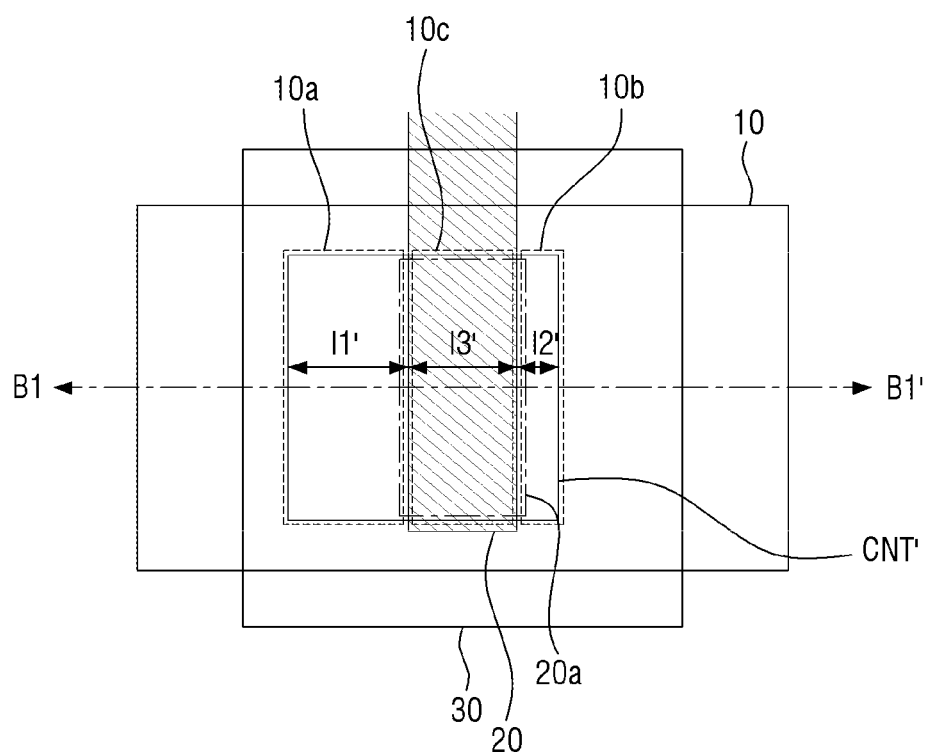
FIG. 11 is a plan view illustrating a case where a left overlay shift occurs in the contact structure according to an embodiment of the present inventive concept.
Figure 12:
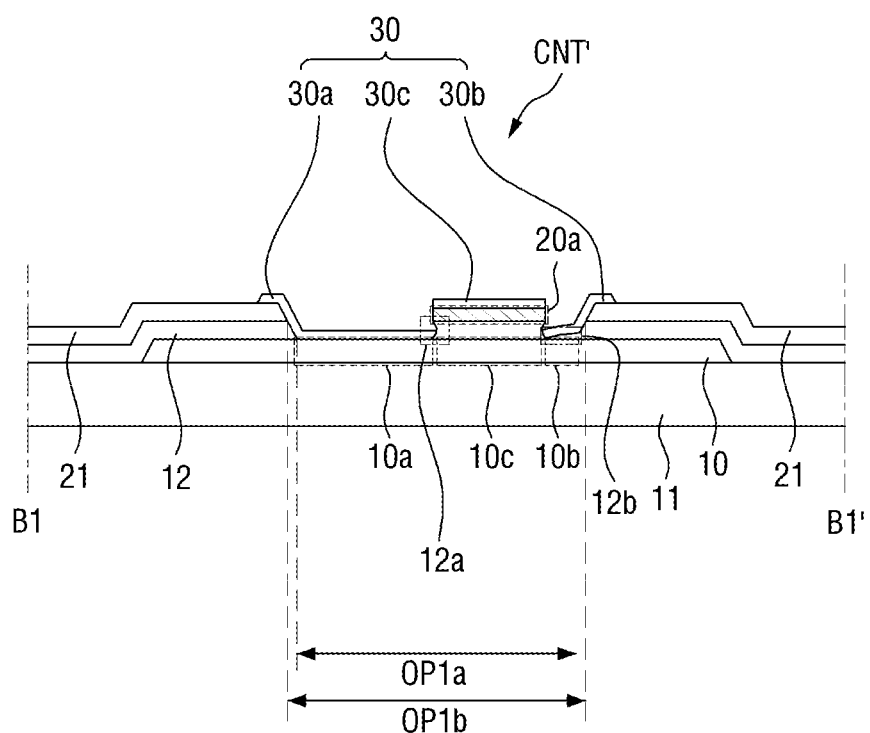
FIG. 12 is a cross-sectional view taken along the line B1-B1' of FIG. 11.
Figure 13:
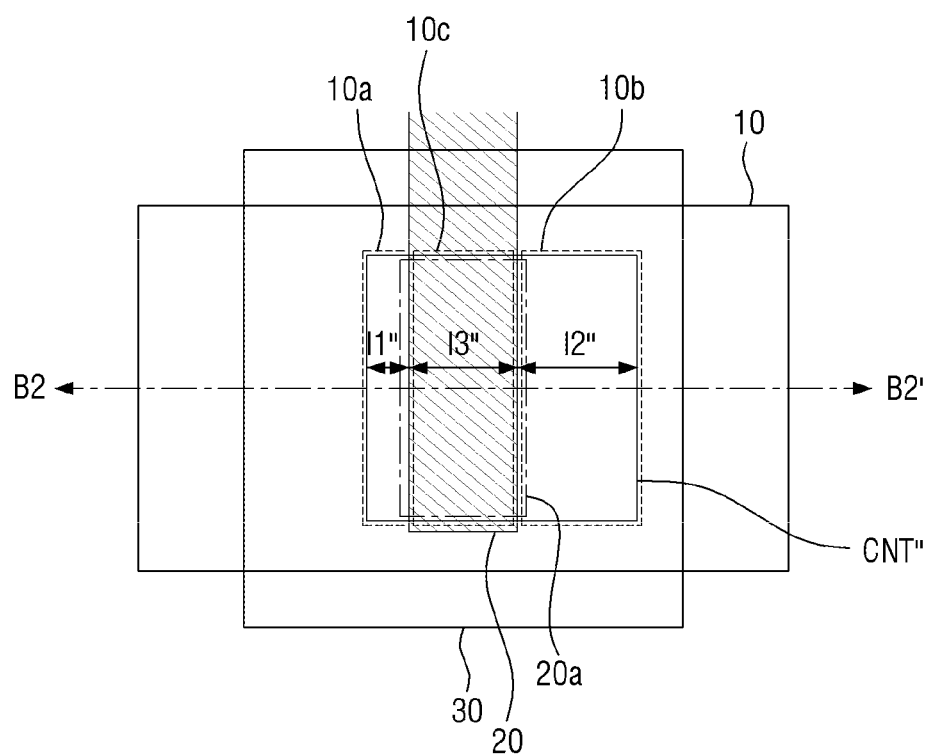
FIG. 13 is a plan view illustrating a case where a right overlay shift occurs in the contact structure according to an embodiment of the present inventive concept.
Figure 14:
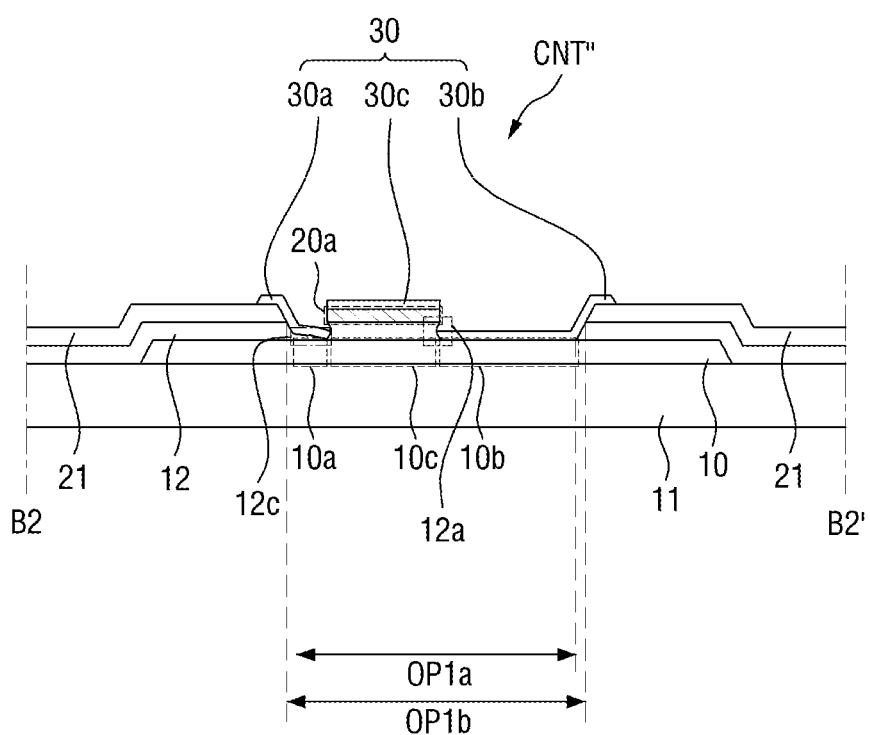
FIG. 14 is a cross-sectional view taken along the line B2-B2' of FIG. 13.

FIG. 11 is a plan view illustrating a case where the left overlay shift occurs in a contact structure in the configuration of the display device according to an embodiment of the present inventive concept. FIG. 12 is a cross-sectional view taken along the line B1-B1' of FIG. 11. FIG. 13 is a plan view illustrating a case where a right overlay shift occurs in the contact structure in the configuration of the display device according to an embodiment of the present inventive concept. FIG. 14 is a cross-sectional view taken along the line B2-B2' in FIG. 13. For the convenience of description, the reference numerals referring to the same configurations will be repeatedly used.

As illustrated in FIG. 11, when a misalignment occurs in the process of formation of the contact hole CNT, a contact hole CNT' illustrated in FIG. 11 may be shifted to the left as compared to the contact hole CNT illustrated in FIG. 1.

That is, the width l1' of the first region 10a of the first electrode 10 may be different from the width l2' of the second region 10b. More specifically, since the width l2' of the second region 10b is relatively smaller than the width l1' of the first region 10a, the sufficient etching space of the first insulating film 12 in the second region 10b may not be secured. In this case, as illustrated in FIG. 12, since a part 12b of the first insulating film portion 12 is not completely etched, the third electrode 30 may not be in contact with the second region 10b of the first electrode 10.

However, even in this case, since a sufficient etching region is secured in the first region 10a having a relatively large width, the third electrode 30 may be in contact with the first region 10a of the first electrode 10. Consequentially, the first electrode 10 and the second electrode 20 may be electrically interconnected through the third electrode 30.

When a misalignment occurs in the process of forming the contact hole CNT as illustrated in FIG. 13, a contact hole CNT" illustrated in FIG. 13 may be shifted to the right, as compared to the contact hole CNT illustrated in FIG. 1.

That is, since the width l1" of the first region 10a of the first electrode 10 is relatively smaller than the width l2" of the second region 10b of the first electrode 10, a sufficient etching space of the first insulating film 12 in the first region 10a may not be secured. In this case, as illustrated in FIG. 14, since a part 12c of the first insulating film 12 is not etched, the third electrode 30 may not be in contact with the first region 10a of the first electrode 10.

However, even in this case, since a sufficient etching region is secured in the second region 10b having a relatively large width, the third electrode 30 may be in contact with the first region 10a of the first electrode 10.

Accordingly, since a sufficient etching space of the first insulating film 12 may be secured in the display device according to an embodiment of the present inventive concept, even when a misalignment occurs in the process of formation of the contact hole CNT, the first electrode 10 and the second electrode 20 may be electrically interconnected through the third electrode 30.

Figure 15:
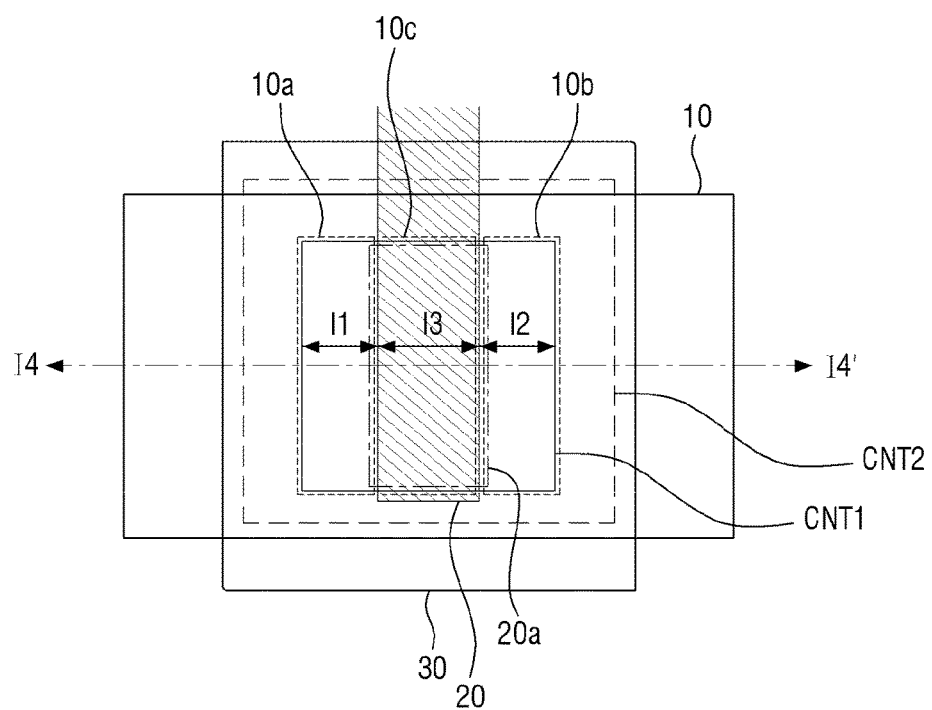
FIG. 15 is a plan view illustrating the contact structure of a display device according to another embodiment of the present inventive concept.
Figure 16:
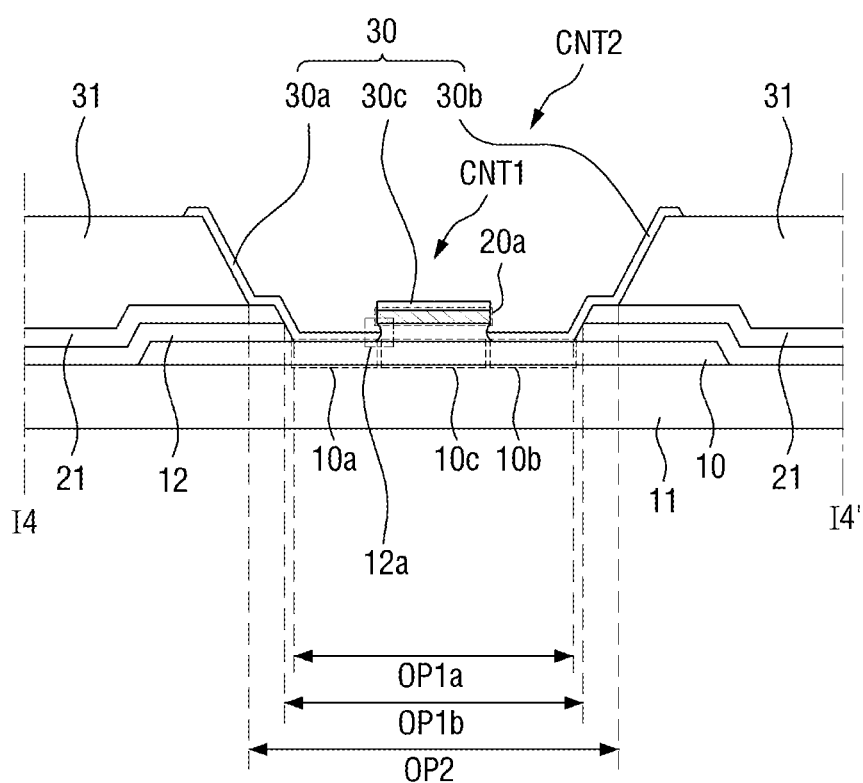
FIG. 16 is a cross-sectional view taken along the line I4-I4' of FIG. 15.

FIG. 15 is a plan view illustrating the contact structure in the configuration of the display device according to another embodiment of the present inventive concept. FIG. 16 is a cross-sectional view taken along the line I4-I4' in FIG. 15. However, the repeated description of the contents described in FIGS. 1 to 14 will not be provided.

Referring to FIGS. 15 and 16, the third insulating film 31 may be disposed on the second insulating film 21.

The first insulating film 12 and the second insulating film 21 may include an inorganic material in an embodiment, and the third insulating film 31 may include an organic material. That is, the third insulating film 31 may be an organic insulating film. The third insulating film 31 may further include a third opening OP2 that exposes the first and second regions 10a and 10b of the first electrode 10 and the fourth region 20a of the second electrode 20.

The third opening OP2 may at least partially overlap the first and second openings and OP1a and OP1b.

The second contact hole CNT2 may be formed by forming the third opening OP2. The second contact hole CNT2 may be at least partially overlap the first contact hole CNT1. Meanwhile, the third insulating film 31 may be a color filter in an embodiment. The color filters, but not limited to, may display one of primary colors such as three primary colors of red, green and blue. The color filter may be formed of a material which displays different colors for each adjacent pixel. The third electrode 30 may be disposed on the third insulating film 31.

Figure 17:
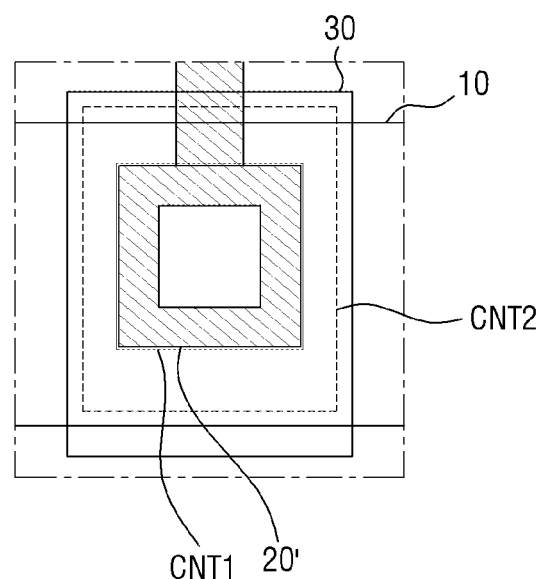
FIG. 17 is a plan view illustrating the contact structure of a display device according to still another embodiment of the present inventive concept.

FIG. 17 is a plan view illustrating the contact structure in the configuration of a display device according to another embodiment of the present inventive concept.

Referring to FIG. 17, a second electrode 20' may have an annular form. Here, the first contact hole CNT1 is a contact hole for etching some parts of the first insulation film 12 and the second insulating film 21 to expose a part of the first electrode 10 and a part of the second electrode 20. Further, the second contact hole CNT2 is a contact hole for etching a part of the organic insulating film 31 disposed on the second insulating film 21 to expose a part of the first electrode 10 and a part of the second electrode 20'.

The second electrode 20' may be included in the first contact hole CNT1. Thus, even when the overlay shift phenomenon caused by the misalignment occurs at the time of forming the first contact hole CNT1, as the exposed portion of the first electrode 10 is located in the annular form of the second electrode 20', it is possible to secure a sufficient etching space of the first insulating film 12.

Accordingly, even when the overlay shift phenomenon occurs at the time of forming the first contact hole CNT1, the first electrode 10 and the second electrode 20' may be electrically connected to each other through the third electrode 30.

Figure 18:
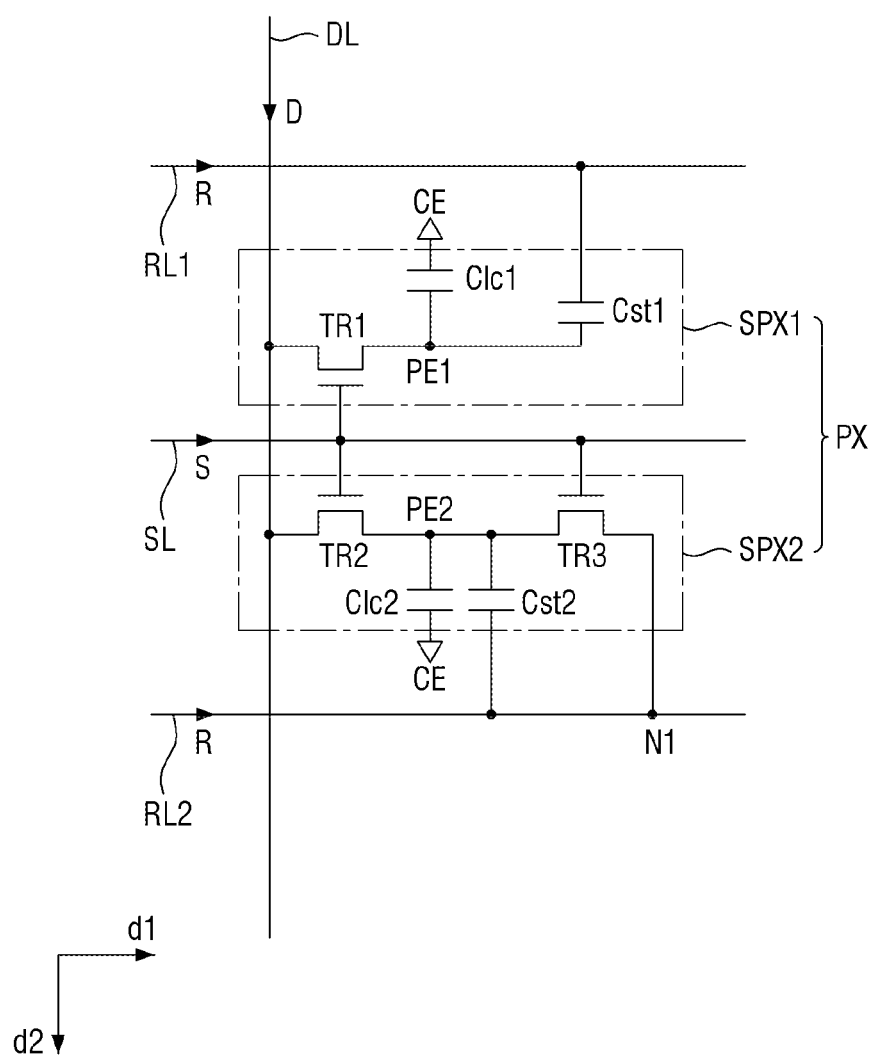
FIG. 18 is an equivalent circuit diagram schematically illustrating a display device having the contact structure according to an embodiment of the present inventive concept.

FIG. 18 is an equivalent circuit diagram schematically illustrating a display device having a contact structure according to an embodiment of the present inventive concept. However, although the present specification describes an example in which the display device is a liquid crystal display, the contact structure may also be applied to other display devices including an organic light emitting display device. Further, although FIGS. 18 to 22 illustrate a structure in which a single pixel portion has two sub-pixel portions as an example, but the present inventive concept is not limited thereto.

Referring to FIG. 18, the pixel portion PX may include first and second sub-pixel portions SPX1 and SPX2.

The pixel portion PX may be connected to a scan line SL and a data line DL. The scan line SL may extend in a first direction d1. The scan line SL may receive a scan signal S from a scan driver. The data line DL may extend in a second direction d2 different from the first direction d1. The data line DL may receive a data signal D from the data driver. The first direction d1 may perpendicularly intersect with the second direction d2. The first direction d1 is illustrated in a row direction, and the second direction d2 is illustrated in a column direction on the basis of FIG. 18.

The first sub-pixel portion SPX1 may include a first switching element TR1 and a first sub-pixel electrode PE1. The first switching element TR1 may be a three-terminal element such as a thin film transistor in an embodiment. A control electrode of the first switching element TR1 may be connected to the scan line SL, and one electrode of the first switching element TR1 may be connected to the data line DL. Further, the other electrode of the first switching element TR1 may be connected to the first sub-pixel electrode PE1. The control electrode of the first switching element TR1 may be a gate electrode, and one electrode may be a source electrode. Further, the other electrode of the first switching element TR1 may be a drain electrode.

The first switching element TR1 is turned on according to the scan signal S provided from the scan line SL and may provide the data signal D provided from the data line DL to the first sub-pixel electrode PE1.

The first sub-pixel portion SPX1 may further include a first liquid crystal capacitor Clc1 formed between the first sub-pixel electrode PE1 and the common electrode CE. The first liquid crystal capacitor Clc1 charges a differential voltage between the voltage provided to the first sub-pixel electrode PE and the voltage provided to the common electrode CE.

The second sub-pixel portion SPX2 may include a second switching element TR2, a third switching element TR3 and a second sub-pixel electrode PE2. The second and third switching elements TR2 and TR3 may be a three-terminal element such as a thin film transistor in an embodiment.

The control electrode of the second switching element TR2 may be connected to the scan line SL, and one electrode of the second switching element TR2 may be connected to the data line DL. The other electrode of the second switching element TR2 may be connected to the second sub-pixel electrode PE2. The control electrode of the second switching element TR2 may be a gate electrode, and one electrode thereof may be a source electrode. Further, the other electrode of the second switching element TR2 may be a drain electrode.

The second switching element TR2 is turned on according to the scan signal S provided from the scan line SL, and may apply the data signal D provided from the data line DL to the second sub-pixel electrode PE2.

The control electrode of the third switching element TR3 may be connected to the scan line SL, and one electrode thereof may be connected to the first node N1. Further, the other electrode of the third switching element TR3 may be connected to the second sub-pixel electrode PE2. The control electrode of the third switching element TR3 may be a gate electrode, and one electrode of the third switching element TR3 may be a source electrode. Further, the other electrode of the third switching element TR3 may be a drain electrode. The third switching element TR3 may be connected to a second storage line RL2 to be described late, through the first node N1.

The third switching element TR3 is turned on according to the scan signal S provided from the scan line SL, and may apply the signal R provided from the second storage line RL2 to the second sub-pixel electrode PE2.

The second sub-pixel portion SPX2 may further include a second liquid crystal capacitor Clc2 formed between the second sub-pixel electrode PE2 and the common electrode CE. Meanwhile, some of the voltage corresponding to the data signal D applied to the second sub-pixel electrode PE2 is divided as the storage signal R is applied to the second sub-pixel electrode PE2. Accordingly, the level of voltage charged to the second liquid crystal capacitor Clc2 is lower than the level of the voltage charged to the first liquid crystal capacitor Clc1.

Thus, since the level of the voltage charged to the first liquid crystal capacitor Clc1 is different from the level of the voltage charged to the second liquid crystal capacitor Clc2, the inclined angles of the liquid crystal molecules of each of the first sub-pixel portion SPX1 and the second sub-pixel portion SPX2 are different from each other. Thus, the brightness of the first sub-pixel portion SPX1 may be different from that of the second sub-pixel portion SPX2. That is, the voltage charged to the first liquid crystal capacitor Clc1 and the voltage charged to the second liquid crystal capacitor Clc2 may be suitably adjusted so that the image viewed from the side surface is maximally closer to the image viewed from the front. It is possible to improve the side visibility of the display device according to an embodiment of the present inventive concept accordingly.

The first and second storage lines RL1 and RL2 may extend in the first direction d1. The storage signal in the form of DC may be provided to the first and second storage lines RL1 and RL2 in an embodiment. The voltage level of the storage signal R is not particularly limited, as long as the voltage level charged to the second liquid crystal capacitor Clc2 may be lower than the voltage level charged to the first liquid crystal capacitor Clc1. As another example, each of the first and second storage lines RL1 and RL2 may also receive storage signals having different levels from each other.

Figure 19:
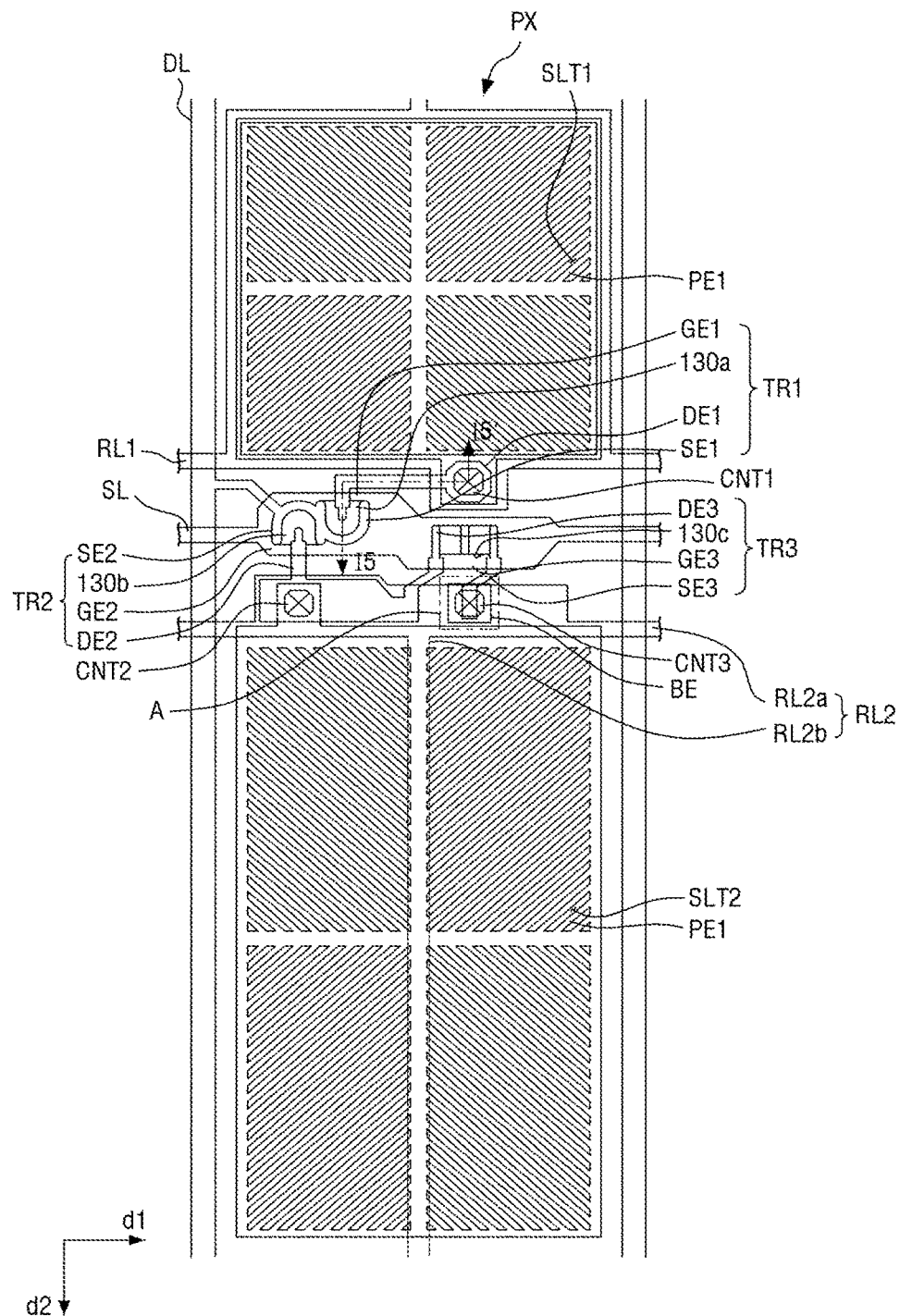
FIG. 19 is a layout diagram schematically illustrating a display device having a contact structure according to an embodiment of the present inventive concept.

The first storage line RL1 may at least partially overlap the first sub-pixel electrode PE1 (see FIG. 19). Further, the second storage line RL2 may at least partially overlap the second sub-pixel electrode PE2.

Thus, the first sub-pixel portion SPX1 may further include the first storage capacitor Cst1 that is formed by the overlap of the first sub-pixel electrode PE1 and the first storage line RL1. That is, one electrode of the first storage capacitor Cst1 may be connected to the first sub-pixel electrode PE1, and the other electrode thereof may be connected to the first storage line RL1.

The second sub-pixel portion SPX2 may further include a second storage capacitor Cst2 formed by the overlap of the second sub-pixel electrode PE2 and the second storage line RL2. That is, one electrode of the second storage capacitor Cst2 is connected to the second sub-pixel electrode PE2, and the other electrode thereof may be connected to the second storage line RL2. Further, the second storage line RL2 may be connected to the one electrode of the third switching element TR3 through the first node N1.

Figure 20:
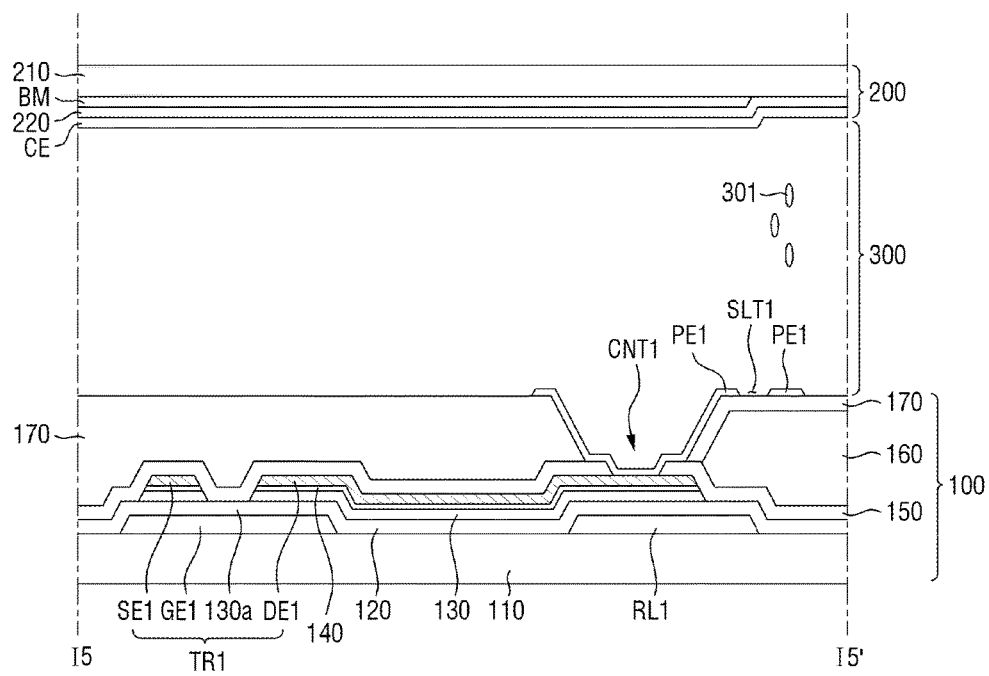
FIG. 20 is a cross-sectional view taken along the line I5-I5' of FIG. 19.
Figure 21:
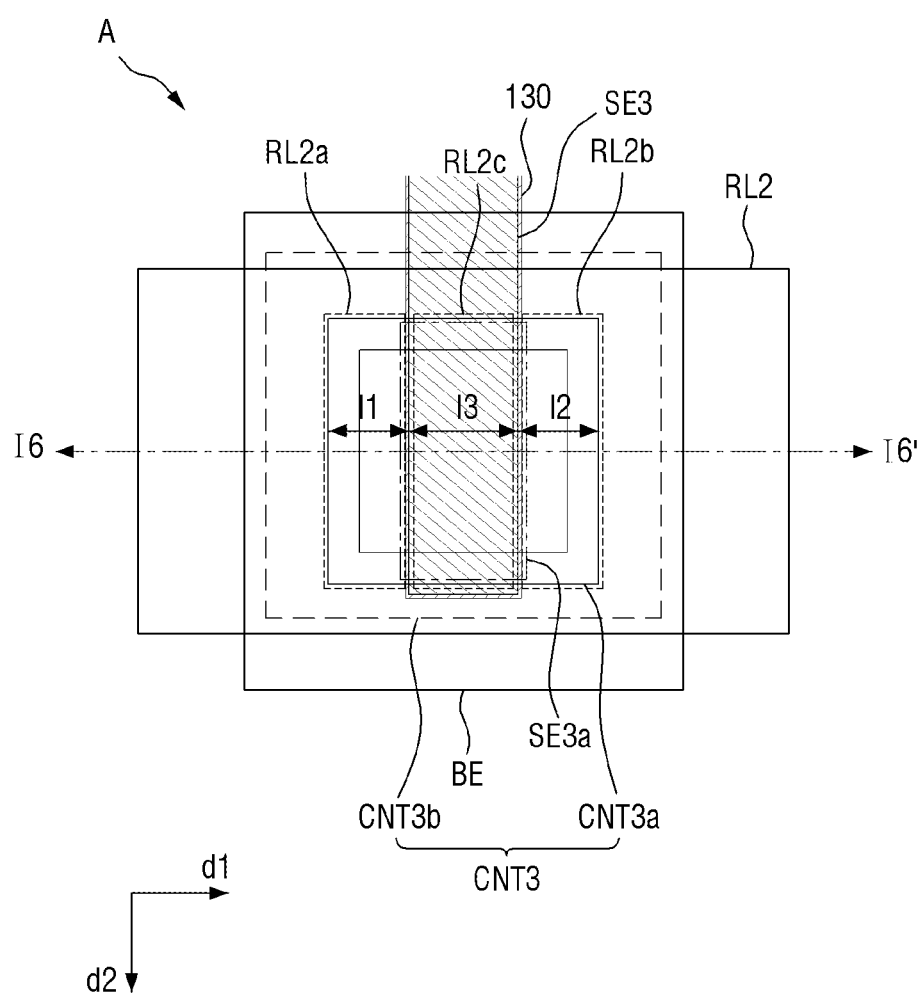
FIG. 21 is an enlarged plan view illustrating a region A of FIG. 19.
Figure 22:
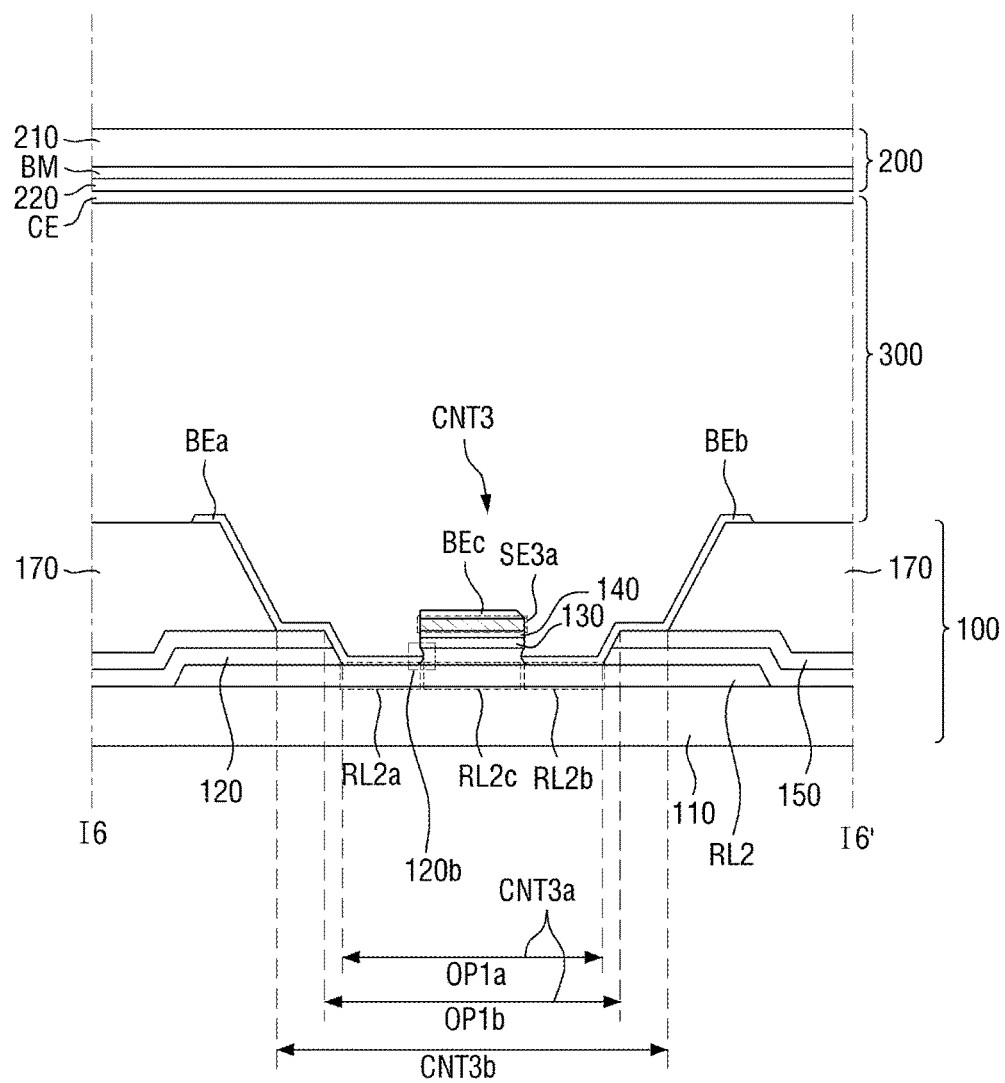
FIG. 22 is a cross-sectional view taken along the line I6-I6' of FIG. 21.

FIG. 19 is a layout diagram schematically illustrating a display device having a contact structure according to an embodiment of the present inventive concept. FIG. 20 is a cross-sectional view taken along the line I5-I5' in FIG. 19. FIG. 21 is an enlarged plan view illustrating a region A of FIG. 19. FIG. 22 is a cross-sectional view taken along the line I6-I6' in FIG. 21. Meanwhile, the cross-sectional configuration will be described on the basis of the first switching device illustrated in FIG. 19.

A lower display panel 100 may be bonded to the upper display panel 200 through sealing. The lower display panel 100 may be disposed to face the upper display panel 200, and a liquid crystal layer 300 having a plurality of liquid crystal molecules 301 may be interposed between the lower display panel 100 and the upper display panel 200.

First, the lower display panel 100 will be described.

The scan line SL, the first to third gate electrodes GE1 to GE3, the first storage line RL1 and the second storage line RL2 may be disposed on the lower substrate 110.

The scan line SL may be disposed to extend in the first direction d1. The first to third gate electrodes GE1 to GE3 may be connected to the scan line SL.

The scan line SL and the first to third gate electrodes GE1 to GE3 may be formed of a single film including conductive metals such as aluminum (Al), copper (Cu), molybdenum (Mo), chromium (Cr), titanium (Ti), tungsten (W), molybdenum-tungsten (MoW), molybdenum-titanium (MoTi) and copper/molybdenum-titanium (Cu/MoTi), a double film including at least two elements or a triple film including three elements.

The first and second storage lines RL1 and RL2 may be disposed on the same layer as the scan line SL on the lower substrate 110. The first and second storage lines RL1 and RL2 may be formed of the same material as the scan line SL and the first to third gate electrodes GE1 to GE3 in an embodiment. Further, the first and second storage lines RL1 and RL2 may be formed simultaneously through the same mask process as the scan line SL and the first to third gate electrodes GE1 to GE3 in an embodiment.

The first storage line RL1 may be disposed on the upper side of the scan line SL as disclosed in FIG. 19. That is, the first storage line RL1 may be disposed to at least partially overlap the first sub-pixel electrode PE1 which will be described later. The first storage line RL1 may be in the form of a rectangular ring that surrounds the first sub-pixel electrode PE1 in an embodiment. However, the shape and size of the first storage line RL1 are not limited to those illustrated in FIG. 2.

The second storage line RL2 may be disposed on the lower side of the scan line SL as disclosed in FIG. 19. The second storage line RL2 may include a horizontal portion RL2a extending in the first direction d1 and a vertical portion RL2b extending in the second direction d2. The horizontal portion RL2a of the second storage line RL2 may be connected to the storage line located in the region of the other pixel portion adjacent to the pixel portion PX. The vertical portion RL2b of the second storage line RL2 may be disposed to at least partially overlap the second sub-pixel electrode PE2.

The vertical portion RL2b of the second storage line RL2 may be disposed to cross the center of the second sub-pixel electrode PE2 in an embodiment.

The gate insulating film 120 may be disposed on the scan line SL, first to third gate electrodes GE1 to GE3, the first storage line RL1 and the second storage line RL2. The gate insulating film 120 may be formed of silicon nitride (SiNx) or silicon oxide (SiOx) in an embodiment. The gate insulating film 120 may also have a multi-film structure including at least two insulating layers with different physical characteristics.

The semiconductor layer 130 may be disposed on the gate insulating film 120. The semiconductor layer 130 may include first to third semiconductor patterns 130a, 130b and 130c that form the channel regions of the first to third switching elements TR1 to TR3.

The semiconductor layer 130 may include an oxide semiconductor. That is, the semiconductor layer 130 may be formed of one selected from the group consisting of In—Ga-Zinc-Oxide (IGZO), ZnO, ZnO2, CdO, SrO, SrO2, CaO, CaO2, MgO, MgO2, InO, In2O2, GaO, Ga2O, Ga2O3, SnO, SnO2, GeO, GeO2, PbO, Pb2O3, Pb3O4, TiO, TiO2, Ti2O3, and Ti3O5. In another embodiment, the semiconductor layer 130 may also be formed of amorphous silicon, polycrystalline silicon or the like.

The ohmic contact layer 140 may be disposed on the top of the semiconductor layer 130. The ohmic contact layer 140 may be made of materials such as n+hydrogenated amorphous silicon doped with n-type impurity such as phosphorus at a high concentration or may be made of silicide. Meanwhile, when the semiconductor layer 130 is made of an oxide semiconductor, the ohmic contact layer 140 may be omitted. In this specification, an example in which the ohmic contact layer 140 is located on the top of the semiconductor layer 130 will be described.

The data line DL, the first to third source electrodes SE1 to SE3 and the first to third drain electrodes DE1 to DE3 may be disposed on the gate insulating film 120 and the ohmic contact layer 140. The data line DL, the first to third source electrode SE1 to SE3 and the first to third drain electrodes DE1 to DE3 may be formed of a single film selected from the group consisting of aluminum (Al), copper (Cu), molybdenum (Mo), chromium (Cr), titanium (Ti), tungsten (W), molybdenum-tungsten (MoW), molybdenum-titanium (MoTi) and copper/molybdenum-titanium (Cu/MoTi), a double film including at least two elements or a triple film including three elements. However, the present inventive concept is not limited thereto, and they may be made of various metals or conductors.

The data line DL, the first to third source electrodes SE1 to SE3, and the first to third drain electrodes DE1 to DE3 may be formed at the same time as the semiconductor layer 130 and the ohmic contact layer 140 through the same mask process. In this case, the data conductor DW may have substantially the same shape as the semiconductor layer 130, except the first to third semiconductor patterns 130a, 130b and 130c of the semiconductor layer 130 which form the channel region of the first to third switching elements TR1 to TR3.

The first source electrode SE1, the first drain electrode DE1, the first semiconductor pattern 130a and the first gate electrode GE1 form the first switching element TR1. The first source electrode SE1 of the first switching element TR1 may be connected to the data line DL. The first drain electrode DE1 of the first switching element TR1 may be connected to the first sub-pixel electrode PE1 through the first contact hole CNT1. The first source electrode SE1 of the first switching element TR1 is disposed on the same layer as the first drain electrode DE1 of the first switching element TR1 to be spaced apart from the first drain electrode DE1 at a predetermined distance. The channel region of the first switching element TR1 may be formed between the first source electrode SE1 and the first drain electrode DE1, according to the scan signal S provided through the first gate electrode GE1.

The second source electrode SE2, the second drain electrode DE2, the second semiconductor pattern 130b and the second gate electrode GE2 form a second switching element TR2. The second source electrode SE2 of the second switching element TR2 may be connected to the data line DL. The second drain electrode DE2 of the second switching element TR2 may be connected to the second sub-pixel electrode PE2 through the second contact hole CNT2. The second source electrode SE2 of the second switching element TR2 is disposed on the same layer as the second drain electrode DE2 of the second switching element TR2 to be spaced apart from the second drain electrode DE2 at a predetermined distance. The channel region of the second switching element TR2 may be formed between the second source electrode SE2 and the second drain electrode DE2, according to the scan signal S provided through the second gate electrode GE2.

The third source electrode SE3, the third drain electrode DE3, the third semiconductor pattern 130c and the third gate electrode GE3 form a third switching element TR3. The third source electrode SE3 of the third switching element TR3 may be connected to the second storage line RL2.

The third switching element TR3 will be more specifically described. The third source electrode SE3 of the third switching element TR3 may be connected with the second storage line RL2 through the third contact hole CNT3.

The third drain electrode DE3 of the third switching element TR3 may be connected to the second sub-pixel electrode PE2. That is, the third switching element TR3 may divide the voltage charged to the second liquid crystal capacitor Clc2, by providing the storage signal R provided from the second storage line RL2 to the second sub-pixel electrode PE2.

The first passivation film 150 may be disposed on the data line DL, the first to third source electrodes SE1 to SE3, the first to third drain electrodes DE1 to DE3 and the gate insulating film 120. The first passivation film 150 may be formed of an inorganic insulating material such as silicon nitride and silicon oxide. The first passivation film 150 may prevent the pigment of the organic insulating film 170 to be described later from flowing into the exposed portion of the semiconductor layer 130.

The color filter 160 may be disposed on the first passivation film 150. The color filter 160 may, but not limited to, display one of primary colors such as three primary colors of red, green and blue. The color filter may be formed of a material which displays different colors for each adjacent pixel. Meanwhile, the color filter 160 may also be disposed on the upper display panel 200 in another embodiment.

The organic insulating film 170 may be disposed on the color filter 160 and the first passivation film 150. The organic insulating film 170 may include an organic material having excellent planarization characteristics and photosensitivity. Meanwhile, the organic insulating film 170 prevents the top of the color filter 160 from detaching, and suppresses contamination of the liquid crystal layer 300 due to organic material such as solvent flowing from the color filter 160, thereby making it possible to prevent defects such as residual image which may be caused when driving a screen.

Meanwhile, the organic insulating film 170 does not necessarily need to be included and may also be omitted.

The first and second sub-pixel electrodes PE1 and PE2 may be disposed on the organic insulating film 170. The first sub-pixel electrode PE1 may be connected to the first drain electrode DE1 of the first switching element TR1 exposed by the first contact hole CNT1. The second sub-pixel electrode PE2 may be connected to the second drain electrode DE2 of the second switching element TR2 exposed by the second contact hole CNT2. The first and second sub-pixel electrodes PE1 and PE2 may also be formed of a transparent conductive material such as ITO or IZO, or a reflective metal such as aluminum, silver, chromium or an alloy thereof.

The first sub-pixel electrode PE1 may include a plurality of first slits SLT1. The plurality of first slits SLT1 forms a fringe field between the first sub-pixel electrode PE1 and the common electrode CE to be described later so that the plurality of liquid crystal molecules 301 can rotate in a particular direction.

Further, the second sub-pixel electrode PE2 may include a plurality of second slits SLT2. The plurality of second slits SLT2 forms a fringe field between the second sub-pixel electrode PE2 and the common electrode CE to be described later so that the plurality of liquid crystal molecules 301 can rotate in a particular direction.

Meanwhile, although it is not illustrated in the drawings, a shielding electrode disposed on the same layer as the first and second sub-pixel electrodes PE1 and PE2 may be further included. The shielding electrode may also be disposed to overlap the data line DL in an embodiment. Thus, the shielding electrode may prevent a light leakage phenomenon due to the coupling between the data line and the sub-pixel electrode adjacent to the data line.

Although it is not illustrated in the drawings, a first alignment film may be disposed on the first sub-pixel electrode PE1 and the second sub-pixel electrode PE2. The first alignment film may be formed of polyimide or the like.

Next, the upper display panel 200 will be described.

The upper substrate 210 may be disposed to face the lower substrate 110. The upper substrate 210 may be formed of a transparent glass or plastic, and may be formed of the same material as the lower substrate 110 in an embodiment.

A black matrix BM for blocking the transmission of light to regions other than the pixel region may be disposed on the upper substrate 210. The black matrix BM may be formed of a metallic material including an organic material or chromium in an embodiment.

An overcoat layer 220 may be disposed on the upper substrate 210 and the black matrix BM. The overcoat layer 220 may be formed of an insulating material and may be omitted in some cases.

The common electrode CE may be disposed on the overcoat layer 220. The common electrode CE may be disposed to at least partially overlap the first and second sub-pixel electrodes PE1 and PE2. The common electrode CE may form the electric field with each of the first and second sub-pixel electrodes PE1 and PE2. The plurality of liquid crystal molecules 301 may be aligned depending on the generated electric field.

However, as mentioned above, as the level of voltage charged to the second liquid crystal capacitor Clc2 is lower than the level of voltage charged to the first liquid crystal capacitor Clc1, the alignment state of a plurality of liquid crystal molecules located between the second sub-pixel electrode PE2 and the common electrode CE becomes different from the alignment state of a plurality of liquid crystal molecules located between the first sub-pixel electrode PE1 and the common electrode CE.

Although it is not illustrated in the drawings, a second alignment film may be formed on the common electrode CE. The second alignment film may be formed of polyimide or the like.

FIG. 21 is an enlarged plan view illustrating a region A of FIG. 19. FIG. 22 is a cross-sectional view taken along the line I6-I6' in FIG. 21. However, the repeated description of the contents described in FIGS. 18 to 20 will not be provided.

Referring to FIGS. 21 and 22, the second storage line RL2 may include a first region RL2a, a second region RL2b and a third region RL2c. The third region RL2c may be located between the first region RL2a and the second region RL2b.

The first region RL2a may be defined as a region disposed on one side of the third region RL2c, while not overlapping a third source electrode SE3 to be described later. Further, the second region RL2b may be defined as a region disposed on the other side of the third region RL2c, while not overlapping the third source electrode SE3 to be described later. The third region RL2c may be defined as a region which is located between the first and second regions RL2a and RL2b, while overlapping the third source electrode SE3 to be described later, more specifically, the fourth region SE3a of the third source electrode SE3.

The width l1 of the first region RL2a, the width l2 of the second region RL2b and the width l3 of the third region RL2c may be identical to one another and may be different from one another. However, each of the widths l1, l2 and l3 of the first to third regions 10a, 10b and 10c is not zero.

The gate insulating film 120 may be disposed on the second storage line RL2. Meanwhile, the gate insulating film 120 may include an undercut portion 120b. The undercut portion 120b will be described later.

The gate insulating film 120 may include a first opening OP1a that exposes the first region RL2a and the second region RL2b of the second storage line RL2. Meanwhile, the first opening OP1a does not expose the third region RL2c of the second storage line RL2. Therefore, the gate insulating film 120 is disposed on the third region RL2c of the second storage line RL2.

The third source electrode SE3 may be disposed on the gate insulating film 120. That is, the third source electrode SE3 may be disposed on the same layer as the data line DL. The third source electrode SE3 at least partially overlaps the second storage line RL2. More specifically, the third source electrode SE3 may include a fourth region SE3a which overlaps the third region RL2c of the second storage line RL2. The third region RL2c of the second storage line RL2 may completely overlap the fourth region SE3a of the third source electrode SE3 in an embodiment.

Meanwhile, the shapes and sizes of the first and second regions RL2a and RL2b are not limited to those illustrated in FIG. 1 as long as the first and second regions RL2a and RL2b exposed by the first opening OP1a. In addition, the shape and size of the third region RL2c overlap the third source electrode SE3, and are not limited to those illustrated in FIG. 1 as long as the third region RL2c is not exposed by the first opening OP1a.

Meanwhile, the shape and size of the fourth region SE3a are not limited to those illustrated in FIG. 1, unless the widths l1 and l2 of each of the first region RL2a and the second region RL2b of the second storage line RL2 are zero.

The first passivation film 150 may be disposed on the third source electrode SE3. The first passivation film 150 may include a second opening OP1b that exposes the first and second regions RL2a and RL2b of the second storage line RL2, and the fourth region SE3a of the third source electrode SE3. The second opening OP1b may at least partially overlap the first opening OP1a.

The organic insulating film 170 may be disposed on the first passivation film 150. The organic insulating film 170 may include a third opening OP2 that exposes first and second regions RL2a and RL2b of the second storage line RL2, and the fourth region SE3a of the third source electrode SE3.

The third contact hole CNT3 is formed by the first opening OP1a, the second opening OP1b and the third opening OP 2, and consequentially exposes the first and second regions RL2a and RL2b of the second storage line RL2, and the fourth region SE3a of the third source electrode SE3.

The connection electrode BE may be disposed on the organic insulating film 170. Therefore, the connection electrode BE may be disposed on the same layer as the first and second sub-pixel electrodes PE1 and PE2. The connection electrode BE may be formed of a transparent conductive material such as ITO and IZO, or a reflective metal such as aluminum, silver, chromium or an alloy thereof in an embodiment.

The connection electrode BE may be formed to cover the third contact hole CNT3. Thus, a portion BEa of the connection electrode BE may be in direct contact with the first region RL2a of the second storage line RL2 that is exposed by the third contact hole CNT3. In addition, another portion BEb of the connection electrode BE may be in direct contact with the second region RL2b of the second storage line RL2 that is exposed by the third contact hole CNT3. Further, still another portion BEc of the connection electrode BE may be in direct contact with the third source electrode SE3 exposed by the third contact hole CNT3, more specifically, the fourth region SE3a.

However, a portion BEa and another portion BEb of the connection electrode BE are not in contact with still another portion BEc of the connection electrode BE within the third contact hole CNT3. That is, as the gate insulating film 120 of FIG. 2 includes an undercut portion 12a, some portions BEa and BEb of the connection electrode BE and the still another portion BEc of the connection electrode BE are not in direct contact with each other.

More particularly, as a portion BEa and another portion BEb of the connection electrode BE are not in direct contact with still another portion BEc of the connection electrode BE, the first and second regions RL2a and RL2b of the second storage line RL2 are not connected to the fourth region SE3a of the third source electrode SE3 within the third contact hole CNT3.

In contrast, a portion BEa of the connection electrode BE is in direct contact with the first region RL2a of the second storage line RL2 exposed by the third contact hole CNT3. Further, another portion BEb of the connection electrode BE is also in direct contact with the second region RL2b of the second storage line RL2 exposed by the third contact hole CNT3.

Also, still another portion of the connection electrode BE is in direct contact with the portion of the third source electrode SE3 exposed by the third contact hole CNT3.

Accordingly, although the second storage line RL2 is not connected to the third source electrode SE3 within the third contact hole CNT3, since some portions of each of the second storage line RL2 and the third source electrode SE3 are connected to the connection electrode BE, the second storage line RL2 and the third source electrode SE3 are electrically connected to each other consequentially.

The description will be given of a case where a predetermined voltage is applied to the second storage line RL2 as an example. When a predetermined voltage is applied to the second storage line RL2, the voltage applied to the second storage line RL2 is transmitted to a portion BEa and another portion BEb of the connection electrode BE being in direct contact with the first region RL2a and the second region RL2b of the second storage line RL2. Thereafter, the predetermined transmitted voltage is transmitted to the third source electrode SE3 through still another portion BEc of the connection electrode BE that is in direct contact with the portion of the second electrode 30 exposed by the third contact hole CNT3. The voltage applied to the second storage line RL2 is transmitted to the third source electrode SE3 accordingly.

Meanwhile, at the time of forming the first and second openings OP1a and OP1b, even when the overlay shift due to misalignment occurs, since the widths of the first region RL2a and the second region RL2b are not zero, a sufficient etching space of the gate insulating film 120 can be secured. Furthermore, even when reducing the size of the third contact hole CNT3 in order to secure a high-resolution and a high aperture ratio, since it is possible to secure the sufficient etching space of the gate insulating film 120, the second storage line RL2 and the third source electrode SE3 may be electrically connected to each other.

Meanwhile, although FIGS. 21 and 22 only describe a connection relation between the second storage line RL2 and the third source electrode SE3, the present inventive concept is not limited thereto. That is, as long as a contact structure is used in the display device, the contact structure according to an embodiment of the present inventive concept may be applied.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A display device comprising:
    a first electrode that comprises a first region, a second region, and a third region located between the first region and the second region;
    a first insulating film disposed on the first electrode;
    a second electrode that is disposed on the first insulating film and comprises a fourth region overlapping the third region;
    a second insulating film disposed on the second electrode;
    a first contact hole formed through the first insulating film and the second insulating film, the first contact hole exposing the first, second and fourth regions; and
    a third electrode that is disposed on the second insulating film to cover the first contact hole, and is connected to at least one of the first region and the second region exposed by the first contact hole and the fourth region exposed by the first contact hole.

2. The display device of claim 1, wherein widths of the first and second regions are not zero.

3. The display device of claim 1, wherein the first and second regions do not overlap the second electrode.

4. The display device of claim 1, wherein the first insulating film comprises at least one undercut portion disposed in a region overlapping the third region.

5. The display device of claim 1, wherein the fourth region completely overlaps the third region.

6. The display device of claim 1, wherein the width of the first region is different from or identical to the width of the second region.

7. The display device of claim 1, wherein at least one of the first and second insulating films comprises an inorganic material.

8. The display device of claim 7, further comprising:
    an organic insulating film disposed on the second insulating film; and
    a second contact hole that at least partially overlaps the first contact hole,
    wherein the third electrode is disposed on the organic insulating film to cover the second contact hole.

9. The display device of claim 1, further comprising:
    a plurality of gate lines disposed on the same layer as the first electrode; and
    a plurality of data lines disposed on the same layer as the second electrode.

10. The display device of claim 1, wherein the third electrode comprises a transparent conductive material.

11. The display device of claim 1, wherein the first and second electrodes comprise an opaque conductive material.

12. A display device comprising:
    a first electrode that comprises a first region, a second region, and a third region located between the first region and the second region;
    a first insulating film that is disposed on the first electrode and comprises a first opening for exposing the first and second regions;
    a second electrode that is disposed on the first insulating film and comprises a fourth region overlapping the third region;
    a second insulating film that is disposed on the second electrode and comprises a second opening for exposing the first, second and fourth regions; and
    a third electrode that is disposed on the second insulating film and is connected to at least one of the first region and the second region, and the fourth region.

13. The display device of claim 12, wherein the second electrode does not overlap the first and second regions.

14. The display device of claim 12, wherein the third electrode comprises a transparent conductive material.

15. The display device of claim 12, further comprising:
    a gate line that is disposed on the same layer as the first electrode and extends in a first direction;
    a data line that is disposed on the same layer as the second electrode, and extends in in a second direction different from the first direction; and
    a pixel electrode disposed on the same layer as the third electrode.

16. The display device of claim 15, wherein the first electrode extends in the first direction, and the third electrode extends in the second direction.

17. The display device of claim 15, wherein the pixel electrode comprises:
    a first sub-pixel electrode connected to a first switching element, the first switching element being connected to the gate line and the data line, and
    a second sub-pixel electrode connected to a second switching element, the second switching element being connected to the gate line and the data line,
    wherein the display device further comprising a third switching element connected to the second sub-pixel electrode, the gate line and the first electrode, and
    wherein the first electrode is a storage line and the second electrode is a source electrode of the third switching element.

18. The display device of claim 12, further comprising:
    an organic insulating film that is disposed on the second insulating film and exposes the first, second and fourth regions,
    wherein the third electrode is disposed on the organic insulating layer and is in contact with the first, second and fourth regions.

19. The display device of claim 12, wherein the widths of the first and second regions are not zero.

20. The display device of claim 12, wherein the width of the first region is identical to or different from the width of the second region.

\* \* \* \* \*